United States Patent [19]

Ohkubo et al.

[11] 4,403,237

[45] Sep. 6, 1983

[54] CHARGE TRANSFER DEVICE HAVING A BENT CHARGE TRANSFER CHANNEL

[75] Inventors: Yoshio Ohkubo, Takatsuki; Tadashi Aoki, Ohtsu; Hiroshi Ohishi, Suita, all of Japan

[73] Assignee: Matsushita Electronics Corporation, Osaka, Japan

[21] Appl. No.: 304,952

[22] Filed: Sep. 23, 1981

Related U.S. Application Data

[63] Continuation of Ser. No. 89,204, Oct. 29, 1979.

[30] Foreign Application Priority Data

Oct. 30, 1978 [JP] Japan ............................. 53-134374

[51] Int. Cl.³ ..................... H01L 29/78; G11C 19/28
[52] U.S. Cl. ......................................... 357/24; 377/63
[58] Field of Search ....................... 357/24; 377/57-63

[56] References Cited

U.S. PATENT DOCUMENTS 3,971,003  7/1976  Kosonocky ................... 357/24 LR
4,160,262  7/1979  Kovac ................................. 357/24

OTHER PUBLICATIONS

Lancaster et al., "A Recirculating CCD with Novel Input and Output Structures", IEEE Int. Electron Devices Meeting (12/74) Tech. Dig., pp. 108–111.

Walsh, "A 190X 244 Charge-Coupled Area Image Sensor . . . ", Symposium Charge-Coupled Device Technology for Scientific Imaging Applications, Pasadena, Calif. (3/75), Proc., pp. 137–149.

*Primary Examiner*—Gene M. Munson
*Attorney, Agent, or Firm*—Burgess, Ryan & Wayne

[57] ABSTRACT

In a charge transfer device wherein the charge transfer channel is bent through a predetermined angle of, for instance, 45°, 90° or 180°, a unit of each bend includes at least two juxtaposed gate electrodes each of which has a portion bent by an angle equal to said predetermined angle relative to the axis of the preceding channel in such a way that the gate electrodes in the bend may be substantially equal in area to those in the straight charge transfer line sections and the channel length in the bend may be substantially equal to that in the straight charge transfer line section, whereby the decrease in transfer efficiency and S/N ratio due to the differences in gate area and channel length may be eliminated.

3 Claims, 6 Drawing Figures

CHARGE TRANSFER DEVICE HAVING A BENT CHARGE TRANSFER CHANNEL

This is a continuation of application Ser. No. 89,204, filed Oct. 29, 1979.

BACKGROUND OF THE INVENTION

The present invention relates to generally a charge transfer device and more particularly a charge transfer device of the type having at least one bend through which the charge transfer channel may be bent by 45°, 90° or 180°.

As is well known in the art, the charge transfer devices are such that the packet of charge or electrons is transferred through the surface layer of a semiconductive substrate in a predetermined direction. A typical charge transfer device comprises in general a signal input stage into which enters the input signal, a charge-transfer stage and an output stage from which the output signal is derived. In response to the clock pulses applied to the gate electrodes in the charge transfer stage, the signal electrons are transferred.

When the charge transfer channel or line is arranged straight, the peripheral area which is required for interconnections becomes a few times in (two dimensional) area as large as the area of the charge transfer channel including the input and output stages. As a result, the packaging or integration density is considerably reduced. Furthermore as the channel length is increased; that is, as the charge transfer stages are increased in number, the semiconductor substrate must be increased in size accordingly. As a result, the handling of the chip from such substrates becomes inconvenient. In addition, as the semiconductor substrates become large in size and the chip cost high, their mechanical strength is reduced.

In order to overcome the above-described problems, there has been devised and demonstrated a charge transfer device wherein the charge transfer channel is bent many times by a predetermined angle of, for instance, 180°. However the bend is different in construction from the straight charge transfer channel or line section so that various problems arise. As will be described in detail with particular reference to FIGS. 1 through 4 of the accompanying drawings, the bend comprises in general 3½ charge transfer stages each of which is by far greater in area than the corresponding stages in the straight charge transfer channel section. It is almost next to impossible to reduce the difference in the gate area in charge transfer stage between the bend and the straight charge transfer channel sections to less than 10%. The difference in gate area results in the variation in charge generation between the bend and the straight charge transfer channel or line section. Especially when the charge transfer devices are used as storage means, a decrease in S/N ratio results because of the nonuniform superposition of dark current upon the output signal.

In addition, the channel length of the bend becomes considerably longer than that of the straight charge transfer channel or line section because the gates in the bend are greater in length than those in the straight charge transfer channel or line section. As a result the time for the complete charge transfer becomes different in the bend and the straight charge transfer channel and the transfer efficiency drops.

Moreover the spacing between the adjacent straight charge transfer line sections is so large that a large surface area of the semiconductor substrate is left unused, thus resulting in a low packaging or integration density.

SUMMARY OF THE INVENTION

In view of the above, the present invention was made to overcome the above and other problems encountered in the prior art charge transfer devices wherein the charge transfer channel or line is bent through the bend or bends of the type described above.

The present invention provides therefore a charge transfer device wherein the charge transfer channel or line is bent at least one time by an integer multiple of 45° through a bend consisting of one or more 45° bend units each of which consists of at least two juxtaposed gate electrodes each of which has a portion which is bent through 45° relative to the axis of the preceding stage.

DETAILED DESCRIPTION OF THE PRIOR ART

Figure 1:
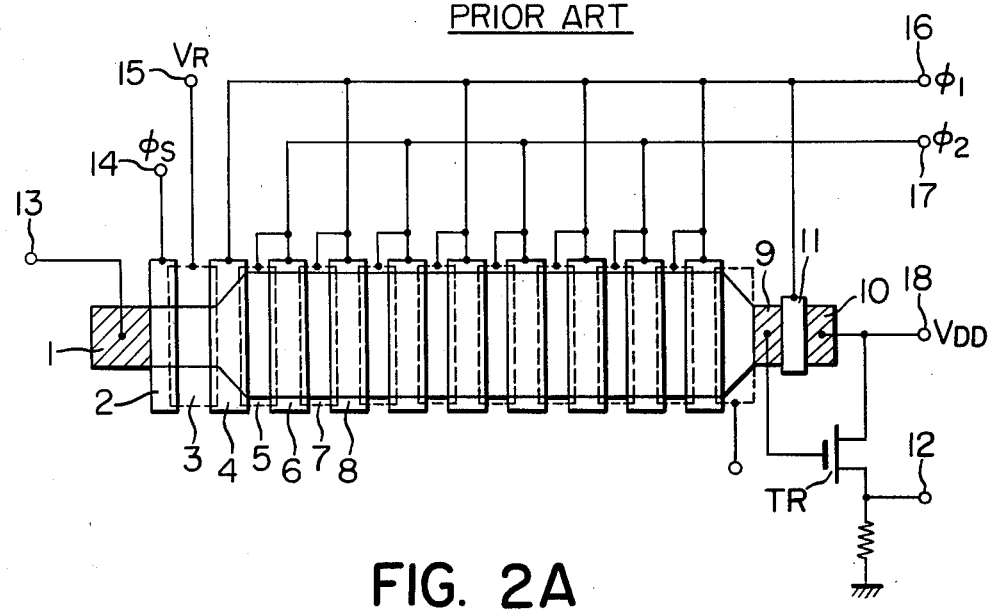
FIG. 1 is a schematic top view of a prior art charge transfer device.

In FIG. 1 is shown a typical prior art charge transfer device. Reference numeral 1 designates a diffusion region or input; 2, a sampling gate for sampling the input signal with the pulse $\phi_s$ which is synchronized with the charge transfer clock pulse; 3, a normally open gate to which is applied DC reference voltage $V_R$ which determines the amount of injected charge; 4, a storage gate for storing the sampled signal charge. 1 through 4 constitute the input stage of the charge transfer channel comprising a plurality of stages each consisting of charge transfer gate electrodes, 5, 6, 7 and 8. The charge transfer channel terminates into the output stage consisting of two diffusion regions 9 and 10 and a gate electrode 11. The signal charge derived from the output stage is derived from the output terminal 12 through a MOS type field-effect transistor TR in a source-follower configuration. 13 is an input terminal; 14, an input terminal to which is applied the pulse $\phi_s$; 15, an input terminal to which is applied DC voltage $V_R$; 16, an input terminal to which is applied the clock pulse $\phi_1$ in first phase; 17, an input terminal to which is applied the clock pulse $\phi_2$ in second phase or in phase opposite to that of the first pulse $\phi_1$; and 18, an input terminal to which is applied power supply voltage $V_{DD}$.

Figure 2A:
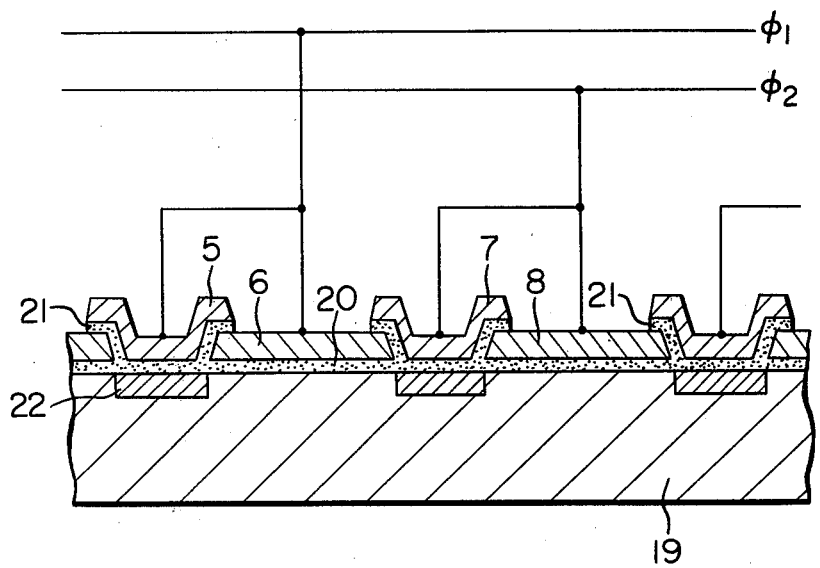
FIG. 2(A) is a schematic sectional view of one charge transfer stage.
Figure 2B:
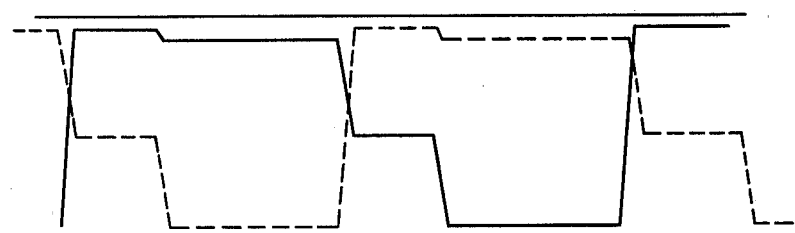
FIG. 2(B) shows the potential energy profiles thereof.

In FIG. 2(A) is shown the construction of the first charge transfer stage consisting of the gate electrodes 5, 6, 7, and 8 and in FIG. 2(B) are shown the potential energy profiles in this stage. As shown in FIG. 2(A) a substrate 19 is overlaid with a gate oxide film 20 in uniform thickness which in turn is overlaid with the charge transfer gate electrodes 5, 6, 7 and 8. The adjacent gate electrodes are overlapped at their ends through the oxide films 21. The gate electrodes 5 through 8 may be formed with metals such as polycrystalline silicon, aluminum or the like and may be deposited with oxide films which electrically isolate the electrode from each other. When the electrons are transferred, the substrate 19 is of P-type. Formed below the gate electrodes (transfer gates) 5 and 7 are diffusion implanted regions 22 of which polarities are of the same type as that of the substrate 19, but have a higher impurity density than the substrate 19. No diffusion region is formed below either the gate electrodes (storage gates) 6 and 8. When the transfer gates 5 and 7 are made of polycrystalline silicon, the oxide film 20 and the oxide film 21 between the gate electrodes are in generally 1000 to 1500 Å in thickness.

With the transfer stage with the above-described construction, the potential energy profiles may be made asymmetrical with respect to the direction of the transfer of charge as shown in FIG. 2(B). The potential energy is distributed as shown by the dotted line curves when the first clock pulse $\phi_1$ is at a high level or "H" while the second clock pulse $\phi_2$ is at a low level or "L", but when the first clock pulse $\phi_1$ is at a low level while the second clock pulse $\phi_2$ is at a high level, the potential energy is distributed as indicated by the solid profile line. As is readily seen from FIG. 2(B), the potential energy profiles are asymmetrical because of the formation of the diffused regions 22.

When a plurality of charge transfer stages with the construction described above are arranged in a straight array, the peripheral area which is required for interconnections is a few times as large as the area of the charge transfer channel including the input and output stages so that the packaging or integration density is very low. In addition, as the number of charge transfer stages is increased, the substrate is increased in size so that the handling of large substrates becomes inconvenient and their mechanical strength is reduced.

Figure 3:
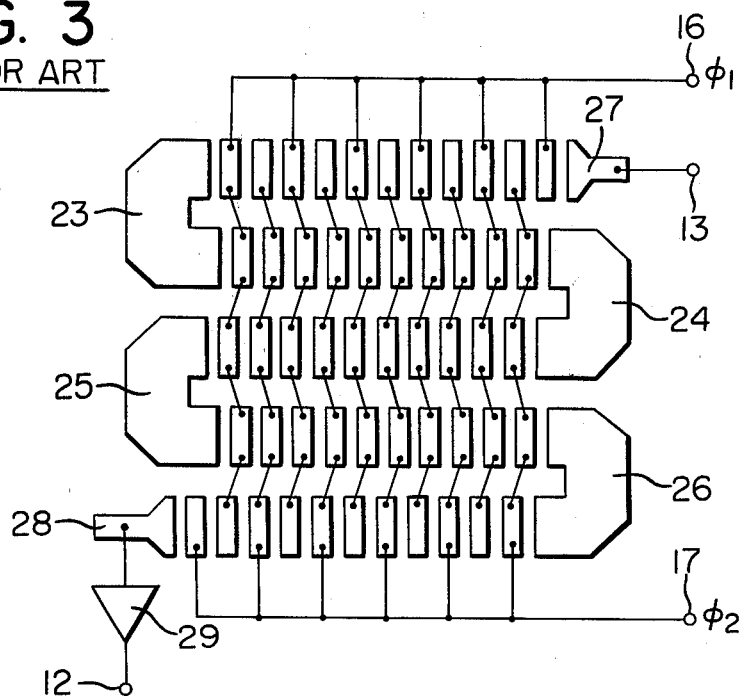
FIG. 3 is a schematic top view of a prior art charge transfer device wherein the charge transfer channel or line is bent zig-zag through 180° bends.

Therefore in order to provide a charge transfer device having a relatively large number of charge transfer stages or channels, the charge transfer channels are zig-zagged with 180° bends 23, 24, 25 and 26 as shown in FIG. 3. Only the storage gates are shown in FIG. 3. 27 is an input stage; 28, an output stage; and 29, a source-follower amplifier.

Figure 4:
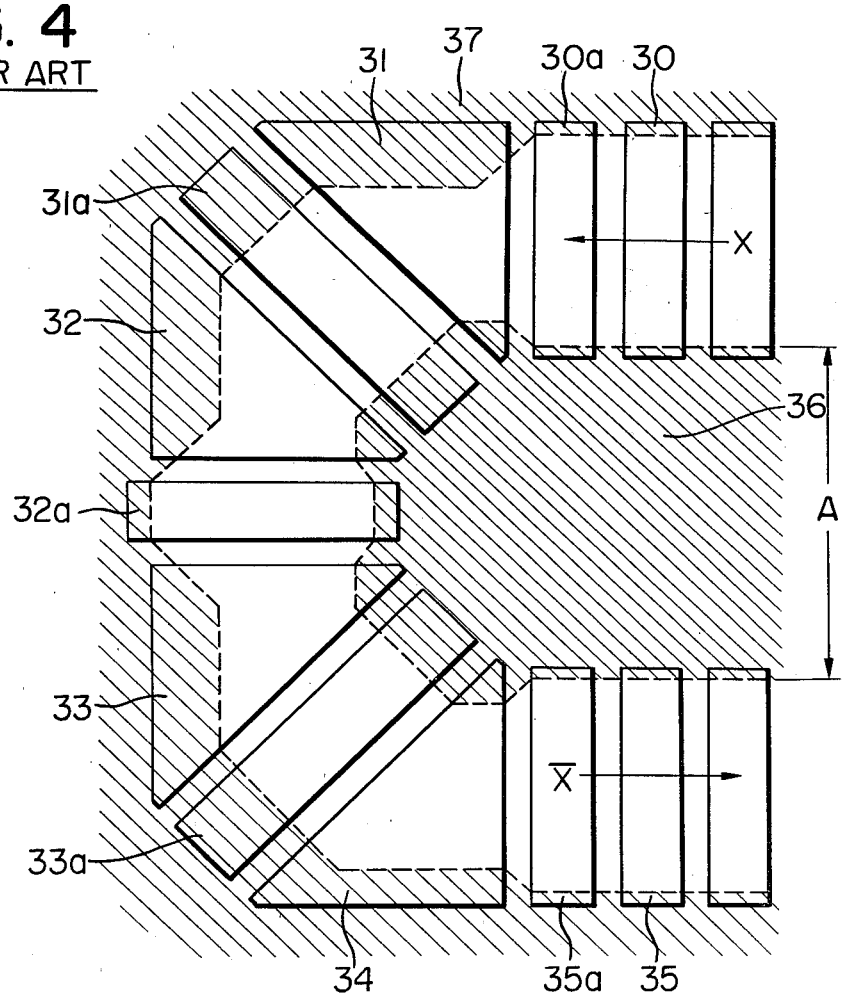
FIG. 4 is a schematic top view of the bend shown in FIG. 3.

The bend as shown in FIG. 4 has been used in bending the charge transfer line or channel by 180°. Only the storage gates are shown in FIG. 4. 30 and 30a are storage gates which constitute the charge transfer stage or the preceeding stage of the bend; 31, 31a, 32, 32a, 33, 33a and 34a are storage gates which constitute the bend; 35 and 35a are storage gates which constitute the last stage of the bend; and 36 and 37 are channel stopper regions.

The signal charge which enters the first stage 30 and 30a in the direction indicated by the arrow X is bent through 180° and leaves the last gates 35a and 35 in the direction indicated by the arrow $\overline{X}$.

The storage gates 30, 31, 32, 33, 34 and 35 are connected to the first clock pulse line $\phi_1$ while the charge storage gates 30a, 31a, 32a, 33a and 35a are connected to the second clock pulse line $\phi_2$.

Moreover the spacing A between the gates in the adjacent straight charge transfer line sections is so large that a large surface area of the semiconductor substrate is left unused, thus resulting in a low packaging or integration density.

DESCRIPTION OF THE PREFERRED EMBODIMENT

Figure 5:
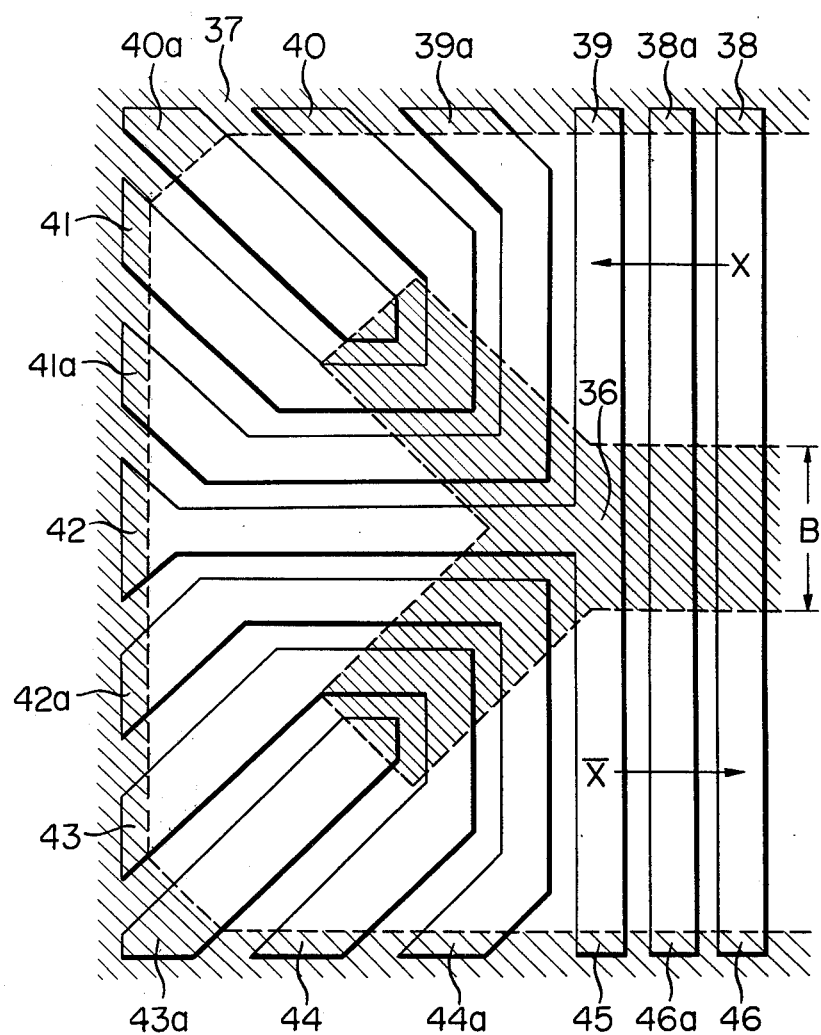
FIG. 5 is a schematic top view of a bend used in the present invention.

In FIG. 5 is shown the construction of the bend of the charge transfer line or channel of the charge transfer device in accordance with the present invention and of the charge transfer stages at both ends of the bend which serves to bend the direction of the signal charge transfer by 180°.

38 and 38a are storage gates which constitute the charge transfer stage at the entering end of the bend; 39, 39a, 40, 40a, 41, 41a, 42, 42a, 43, 43a, 44, 44a and 45 are storage gates which constitute the bend properly; 46 and 46a are storage gates which constitute the charge transfer stage at the leaving end of the bend; and 36 and 37 are channel stopper regions. The storage gates 38, 39, 40, 41, 42, 43, 44, 45 and 46 are connected to the first clock pulse line $\phi_1$ while the storage gates 38a, 39a, 40a, 41a, 42a, 43a, 44a and 46a are connected to the second clock pulse line $\phi_2$. The signal charge which enters the bend in the direction indicated by the arrow X is bent through 180° by the bend and leaves its charge transfer stage in the direction indicated by the arrow $\overline{X}$. More particularly the signal charge is bent through 45° four times through four bend elements consisting of 6½ charge transfer stages as a whole.

As is clearly seen from FIG. 5, the storage gates 39a and 41a are formed integrally and have portions bent through 45° with respect to the vertical and horizontal respectively. Same is true for the storage electrodes 40 and 41; the storage electrode pair 42a and 44a; and the storage electrodes 43 and 44. That is, first the signal charge is bent through 45° when it passes through the storage gates from 38a to 40a. Next the signal charge is further bent through 45° when it passes through the storage gates from 40a to 42. The signal charge is bent through 45° when it passes through the storage gates from 42 to 43a and is further bent through 45° when passing through the storage gates 43a to 46a. As a result of the four 45° bendings, the signal charge is bent through 180°. In FIG. 5, two storage gates 39a and 40; 41 and 41a; 42a and 43; and 44 and 44a each having the 45° bend portion are arranged adjacent to each other so as to bend the signal charge through 45°, but it is to be understood that more than two storage electrode gates each having the 45° bend portion may be arranged adjacent to each other.

With the construction shown in FIG. 5, the straight charge transfer line or channel and the bend are made substantially same in dimension as shown below.

|  | storage gate | (micron²) transfer gate |
| --- | --- | --- |
| First stage in straight section | 432 | 216 |
| Bend | | |
| first gate (39) | 430 | |
| | | 221 |
| second gate (39a) | 432 | |
| | | 216 |
| third gate (40) | 440 | |
| | | 215 |
| fourth gate (40a) | 448 | |
| | | 222 |
| fifth gate (41) | 436 | |
| | | 210 |
| sixth gate (41a) | 449 | |
| | | 238 |
| seventh gate (42) | 457 | |

It is seen that according to the present invention the storage and transfer gates are substantially same in area both in the straight and bent portions. As a result the decrease in transfer efficiency and S/N ratio due to the difference in gate area and channel length may be eliminated. In addition, the smooth bending through 180° of the signal charge may be attained.

According to the present invention, the integral storage gates 39, 42 and 45; 40 and 41; and 43 and 44 are connected to the first clock pulse line $\phi_1$ while the integral storage gates 39a and 41a; 42a and 44a are connected in common to the second clock pulse line $\phi_2$. As a result, even when the lead wire to, for instance, the storage gate 39 is broken off, the storage gate 39 may be supplied with the clock pulse $\phi_1$ through the storage electrode 42 which is connected through a lead wire to the first clock pulse line $\phi_1$ so that the charge transfer device of the present invention is highly reliable in operation.

In the prior art charge transfer devices, the gates in the bend are greater in area by 60% than the gates in the straight line, but according to the present invention the difference in area between them is only 10%. Furthermore the width B of the channel stop region 36 may be reduced as compared with the prior art devices so that the substrate may be reduced in area.

So far the present invention has been described in conjunction with the two-phase clock, surface channel type charge transfer device, but it is to be understood that the present invention may be equally applied to other systems such as three- or four-phase clock system or to a two phase system wherein one of the clock pulses $\phi_1$ and $\phi_2$ is DC voltage. Furthermore the present invention may be also applied to a system wherein a transfer channel includes a buried channel structure. Moreover the present invention may be applied to the bending of the signal charge not only through 180° but also through any desired angles such as 45°, 90° and 135°. That is, when it is desired to bend only through 45°, the gates succeeding the gate 41 inclusive may be eliminated. When it is desired to bend through 90°, the gates succeeding the gate 42a inclusive may be eliminated. When it is desired to bend through 135°, the gates succeeding the gate 44 inclusive may be eliminated.

What is claimed is:

1. A charge transfer device having a bent charge transfer channel, comprising:
   a semiconductor substrate;
   an insulating layer disposed on a major surface of said substrate, said charge transfer channel being disposed in said substrate adjacent said major surface;
   an input stage of said channel comprising at least one gate electrode disposed on said insulating layer;
   a second series of adjacent gate electrodes linearly disposed on said insulating layer and comprising a straight line intermediate state of said channel extending in a given charge transfer direction;
   a third series of adjacent gate electrodes disposed on said insulating layer and including at least two juxtaposed electrodes for providing a bend in said channel to change said charge transfer direction by an integral multiple of 45 degrees,
   each of said juxtaposed electrodes having (i) a first part adjacent the inside of said bend and extending substantially orthogonal to said charge transfer direction, and (ii) a second part contiguous with one end of said first part adjacent the outside of said bend and extending at an angle of substantially 45 degrees with respect to said charge transfer direction, both parts of one of said juxtaposed electrodes being adjacent said one gate electrode of said input stage and operatively coupled thereto for charge transfer therebetween; and
   an output stage of said channel comprising at least one gate electrode disposed on said insulating layer, both parts of another of said juxtaposed electrodes being adjacent said one gate electrode of said output stage and operatively coupled thereto for charge transfer therebetween,
   said intermediate stage and said bend being disposed seriatim between said input and output stages for providing a bent channel charge transfer device.

2. A charge transfer device as set forth in claim 1 wherein
   one end of said intermediate stage is connected to one end of said bend which alters said charge transfer direction by 180°, further comprising a second straight charge transfer line section one end of which is connected to the other end of said bend, another bend one end of which is connected to the other end of said second straight charge transfer line section and alters said charge transfer direction by 180°, and a third straight charge transfer line section one end of which is connected to the other end of said other bend.

3. A charge transfer device as set forth in claim 2, wherein
   the gate electrodes in said first and second bends are substantially equal in area to those in said intermediate, second and third straight charge transfer line sections.

* * * * *